US009143139B1

(12) United States Patent
Xiu

(10) Patent No.: US 9,143,139 B1
(45) Date of Patent: Sep. 22, 2015

(54) MICROELECTRONIC SYSTEM USING TIME-AVERAGE-FREQUENCY CLOCK SIGNAL AS ITS TIMEKEEPER

(71) Applicant: Liming Xiu, Plano, TX (US)

(72) Inventor: Liming Xiu, Plano, TX (US)

(73) Assignee: Liming Xiu, Plano, TX (US)

( * ) Notice: Subject to any disclaimer, the term of this patent is extended or adjusted under 35 U.S.C. 154(b) by 0 days.

(21) Appl. No.: 14/076,332

(22) Filed: Nov. 11, 2013

(51) Int. Cl.
*H03L 7/00* (2006.01)
*H03K 3/64* (2006.01)
*H03K 3/03* (2006.01)
*H03K 99/00* (2013.01)

(52) U.S. Cl.
CPC .. *H03L 7/00* (2013.01); *H03K 3/03* (2013.01); *H03K 3/64* (2013.01); *H03K 99/00* (2013.01)

(58) Field of Classification Search
CPC .............. H03L 7/00; H03K 3/00; H03K 3/02; H03K 3/64; H03K 99/00
See application file for complete search history.

(56) References Cited

U.S. PATENT DOCUMENTS

| | | | | |
|---|---|---|---|---|
| 6,215,423 B1 * | 4/2001 | May et al. | ......... | 341/61 |
| 6,509,800 B2 * | 1/2003 | Stockton | ......... | 331/11 |
| 6,940,937 B2 * | 9/2005 | Xiu et al. | ......... | 375/376 |
| 7,065,172 B2 * | 6/2006 | Xiu et al. | ......... | 375/376 |
| 7,372,340 B2 * | 5/2008 | Xiu et al. | ......... | 331/45 |
| 7,406,588 B2 * | 7/2008 | Lin et al. | ......... | 712/219 |
| 7,606,849 B2 * | 10/2009 | Kushnick | ......... | 708/271 |
| 7,649,393 B2 * | 1/2010 | Maeda | ......... | 327/198 |
| 7,764,131 B1 * | 7/2010 | Seth et al. | ......... | 331/46 |
| 7,808,273 B2 * | 10/2010 | Flynn | ......... | 326/46 |
| 8,120,389 B2 * | 2/2012 | Xiu | ......... | 327/105 |
| 8,195,972 B2 * | 6/2012 | Renner et al. | ......... | 713/401 |
| 8,928,386 B1 * | 1/2015 | Ganusov et al. | ......... | 327/293 |
| 9,036,755 B2 * | 5/2015 | Xiu | ......... | 375/355 |
| 2014/0197867 A1 * | 7/2014 | Xiu | ......... | 327/105 |

OTHER PUBLICATIONS

L. Xiu, "The Concept of Time-Average-Frequency and Mathematical Analysis of Flying-Adder Frequency Synthesis Architecture", IEEE Circuit and System Magazine, Third Quarter 2008, pp. 27-51.*
L. Xiu, "Nanometer Frequency Synthesis beyond Phase Locked Loop", Aug. 2012, John Wiley IEEE press.*
L. Xiu, "VLSI Circuit Design Methodology Demystifie", Nov. 2007, John Wiley IEEE press.*

* cited by examiner

*Primary Examiner* — Thomas J Hiltunen

(57) ABSTRACT

A microelectronic system comprises at least one circuit block that performs certain signal processing functions and at least one clock generation circuit that produces at least one Time-Average-Frequency clock signal which comprises clock pulses of at least two different lengths. The said lengths are measured in time. The arithmetic mean of the lengths of all the pulses that exist in a time frame of one second is calculated. The Time-Average-Frequency clock pulse train is made in such way that the arithmetic inversion of the said arithmetic mean equals to a predetermined value that is the clock frequency of the Time-Average-Frequency clock signal. At least one said circuit block in the said microelectronic system is driven by the said Time-Average-Frequency clock signal. The said circuit block is setup-constrained using the minimum pulse length found among the lengths of all the pulses in the Time-Average-Frequency clock signal.

6 Claims, 3 Drawing Sheets

MICROELECTRONIC SYSTEM USING TIME-AVERAGE-FREQUENCY CLOCK SIGNAL AS ITS TIMEKEEPER

FIELD OF THE INVENTION

The present invention generally relates to the field of integrated circuit. More specifically, embodiments of the present invention pertain to a clocking mechanism for VLSI (Very Large Scale Integrated) circuit and system using Time-Average-Frequency.

DISCUSSION OF THE BACKGROUND

Inside a today's typical VLSI system, there are millions of electrical signals. They make the system perform what it is designed to do. Among those, the most important one is the clock signal. From an operational perspective, clock is the timekeeper of the electrical world inside the chip. From a structural perspective, clock generator is the heart of the chip; clock signal is the blood; and clock distribution network is the vessel.

Timekeeper has played and is playing a critical role in our human life. History shows that the progressive advancement of our civilization is only made possible by the steady refinement of the timekeeper: the clock/watch. The same is true for VLSI system. The purpose of VLSI system is for processing information. The efficiency of performing this task is highly dependent on the time scale used. This time scale is controlled by the clock signal. It has two key aspects: its size (the absolute clock frequency) and its resolution (the capability of differentiating nearby frequencies). In addition, another characteristic is also important: the speed that time scale can be switched from one to another (the speed of clock frequency switching). Phase Locked Loop (PLL) has traditionally been used as on-chip generator of clock signal. It is a beautiful blend of digital and analog circuits in one piece of hardware. From a reference time scale, it can generate other time scales. However, due to its usage of compare-then-correct feedback mechanism, the choice of time scales that can be produced is limited. Equally serious is the problem that the change of time scale (frequency switching in PLL) takes very long time. Although PLL has played a key role that makes today's VLSI system magnificent, these two problems are limiting chip architect's capability for creating further innovation.

The source of the problem originates from the very fact that electrical circuit is not born for handling time, but magnitude (or level). Inside a circuit, information is represented by the medium of electron. It is created on the magnitude of electron flow, using proportional (analog) or binary (digital) relationships. Time is created indirectly through a voltage level crossing a predetermined threshold. Therefore, the task of building a timekeeper inside VLSI system is inherently difficult. In implementation, another fact has made the task of creating time inside circuit even more challenging: since the first day that clock signal is introduced into VLSI design, it is assumed that all the pulses inside a particular clock pulse train have to be equal-in-length. This presupposition has limited our options in the creation of timekeeper circuit. Consequently, our current solution is not completely satisfactory: 1) we cannot generate any arbitrary clock frequency we want. 2) we cannot switch the frequency of clock signal quickly.

Since timekeeper controls VLSI system's operation pace through clock-driving-circuit, a fundamental question can be asked: do all the pulses in a clock pulse train have to be equal-in-length? This question is equivalent to asking: what does clock frequency really mean? In 2008 a novel concept, Time-Average-Frequency, is introduced [1]. It removes the constraint that all pulses (or clock cycles) must be equal-in-length. It is based on the understanding that clock frequency is used to indicate the number of operations executed (or events happened) within the time window of one second. As long as the specified number of operations is completed successfully in a specified time window (such as one billion operations within one second for a 1 GHz CPU), the system does not care how each operation is carried out in detail.

This "Discussion of the Background" section is provided for background information only. The statements in this "Discussion of the Background" are not an admission that the subject matter disclosed in this "Discussion of the Background" section constitutes prior art to the present disclosure, and no part of this "Discussion of the Background" section may be used as an admission that any part of this application, including this "Discussion of the Background" section, constitutes prior art to the present disclosure.

SUMMARY OF THE INVENTION

It is therefore an object of the present invention to use Time-Average-Frequency concept to clock microelectronic systems whose clock signals' frequency can be adjusted in very fine step such as in sub-ppm range and can be switched in very fast speed such as in two cycles. It is a further object of the present invention to provide the microelectronic system driven by such clock signal with the opportunity of creating lower-cost and better-performance solutions in higher-than-circuit level, such as in system and architecture level.

Embodiments of the present invention relate to circuitries and systems using Time-Average-Frequency in their clock signals. The circuitries and systems generally comprise (a) at least one circuit block that (i) receives an incoming clock signal and (ii) performs signal processing tasks using said clock signal as its time keeper, (b) at least one clock generator that (i) produces at least one clock signal by using Time-Average-Frequency, and (ii) sends the said Time-Average-Frequency clock signal to at least one of the said circuit block(s).

The present invention relates to circuits and systems that use Time-Average-Frequency in their clocks. Thus, the present invention advantageously utilizes its features of fine frequency resolution and fast frequency switching enabled by Time-Average-Frequency clock generator. This circuit level enabler provides opportunities for innovation in system and architecture levels. This can result in microelectronic systems that are lower cost and have better performance. These and other advantages of the present invention will become readily apparent from the detailed description of the preferred embodiment below.

DETAILED DESCRIPTION

Figure 1:
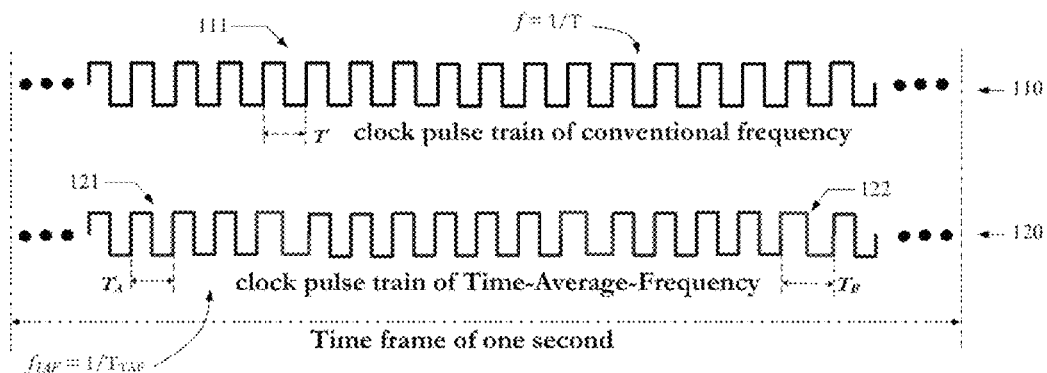
FIG. 1 is a diagram showing a conventional frequency clock signal waveform and a Time-Average-Frequency clock signal waveform.

Reference will now be made in detail to various embodiments of the invention, examples of which are illustrated in the accompanying drawings. While the invention will be described in conjunction with the following embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description, numerous specific details are set forth in order to provide a thorough understanding of the present invention. However, it will be readily apparent to one skilled in the art that the present invention may be practiced without these specific details. In other instances, well-known methods, procedures, components, and circuits have not been described in detail so as not to unnecessarily obscure aspects of the present invention.

Some portions of the detailed descriptions that follow are presented in terms of processes, procedures, logic blocks, functional blocks, processing, and other symbolic representations of operations on data bits, data streams or waveforms within a computer, processor, controller and/or memory. These descriptions and representations are generally used by those skilled in the arts of VLSI-circuit-and-system design to effectively convey the substance of their work to others skilled in the art. A process, procedure, logic block, function, process, etc., is herein, and is generally, considered to be a self-consistent sequence of steps or instructions leading to a desired and/or expected result. The steps generally include physical manipulations of physical quantities. Usually, though not necessarily, these quantities take the form of electrical, magnetic, optical, or quantum signals capable of being stored, transferred, combined, compared, and otherwise manipulated in a computer or data processing system. It has proven convenient at times, principally for reasons of common usage, to refer to these signals as bits, waves, waveforms, streams, values, elements, symbols, characters, terms, numbers, or the like.

It should be borne in mind, however, that all of these and similar terms are associated with the appropriate physical quantities and are merely convenient labels applied to these quantities. Unless specifically stated otherwise and/or as is apparent from the following discussions, it is appreciated that throughout the present application, discussions utilizing terms such as "processing," "operating," "computing," "calculating," "determining," "manipulating," "transforming," "displaying" or the like, refer to the action and processes of a computer or signal processing system, or similar processing device (e.g., an electrical, optical, or quantum computing or processing device), that manipulates and transforms data represented as physical (e.g., electronic) quantities. The terms refer to actions and processes of the processing devices that manipulate or transform physical quantities within the component(s) of a system or architecture (e.g., registers, memories, flip-flops, other such information storage, transmission or display devices, etc.) into other data similarly represented as physical quantities within other components of the same or a different system or architecture.

Furthermore, for the sake of convenience and simplicity, the terms "clock," "time," "rate," "period," "frequency" and grammatical variations thereof are generally used interchangeably herein, but are generally given their art-recognized meanings. Also, for convenience and simplicity, the terms "data," "data stream," "waveform" and "information" may be used interchangeably, as may the terms "connected to," "coupled with," "coupled to," and "in communication with" (each of which may refer to direct or indirect connections, couplings, and communications), but these terms are also generally given their art-recognized meanings.

Referring now to FIG. 1, a clock signal 110 is made of a pulse train that contains many individual electrical pulses 111. In conventional construction of clock signal the lengths of all such pulses, which are measured in time, are equal (implementation imperfection, such as clock jitter, is not considered in this discussion). This length-in-time is termed clock period T. The clock frequency f is defined as its arithmetic inversion, expressed in (1). An example can be provided as such: T=20.04 ns and consequently f=1/T=49.9 MHz. Clock frequency f=49.9 MHz can be interpreted as the fact that there are 49.9 millions electrical pulses 111 of clock period T=20.04 ns existed in a time frame of one second.

$$f = 1/T \quad (1)$$

Referring again to FIG. 1, a clock signal of Time-Average-Frequency 120 is also made of a pulse train that contains many individual electrical pulses. But the length-in-times of those pulses can be different. Instead of only one type of pulse in conventional clock pulse train, two or more types of pulses can be used in Time-Average-Frequency clock pulse train. In a Time-Average-Frequency clock pulse train 120 shown in FIG. 1, pulse types $T_A$ 121 and $T_B$ 122 are used. The clock period $T_{TAF}$ and the clock frequency of Time-Average-Frequency $f_{TAF}$ are defined in (2) where $0 \le r \le 1$ is a fraction number that represents the possibility of $T_A$ 121 and $T_B$ 122 occurrence. For example, two types of pulses $T_A$=20 ns and $T_B$=20.1 ns are used in a Time-Average-Frequency clock signal. If r=0.4, by using (2), $T_{TAF}$=20.04 ns and $f_{TAF}$=49.9 MHz. From this example and the previous example, it is clear that the same 49.9 MHz clock frequency is achieved but through different methods. The end result is the same fact that there are 49.9 millions electrical pulses occurred in a time frame of one second. In the construction of Time-Average-Frequency clock signal, there are in general n types of clock pulses that can be used where n is an integer and $a_i$ are fractions and $a_i \le 1$. Thus, the general form of $T_{TAF}$ and $f_{TAF}$ is given in (3).

$$T_{TAF} = (1-r) \cdot T_A + r \cdot T_B; \quad f_{TAF} = 1/T_{TAF} \quad (2)$$

$$T_{TAF} = a_1 \cdot T_1 + a_2 \cdot T_2 + \ldots + a_n \cdot T_n, \; \Sigma a_i = 1 \text{ for } i=1 \text{ to } n;$$
$$f_{TAF} = 1/T_{TAF} \quad (3)$$

One of the important techniques of generating conventional clock signal is to use Phase Locked Loop (PLL). From a reference electrical pulse train, the PLL uses compare-then-correct feedback mechanism to construct a new pulse train of different frequency. The key building blocks inside PLL are phase and frequency detector, frequency divider and voltage controlled oscillator (VCO). The VCO is used to produce a pulse train. Theoretically, when PLL is in lock state, all the pulses in its output clock pulse train will have same length-in-time whose value is determined by the divider used in the loop. The relationship between the length-in-times of reference pulse and the output pulse can be expressed as $T_{ref} = N \cdot T_{out}$ where $T_{ref}$ and $T_{out}$ are the clock periods of reference pulse and output pulse, respectively. N is the divider ratio. In most cases, N is an integer. Since N only can take integer values from a specified range, the choice of $T_{out}$ is limited. In other words, the available frequencies from a PLL are limited.

It can be understood that, compared to conventional frequency clock generation method, Time-Average-Frequency clocking approach has the capability of generating more frequencies since, instead of only one type of pulse being allowed, several types of pulses can be used. In other words, many more frequencies can be generated by Time-Average-Frequency approach since 1) the sizes of those different types of clock pulses can be adjusted. 2) the occurrence possibilities of these pulses can be adjusted. Thus more-available-frequencies, which is equivalent to finer frequency resolution, is the first advantage of Time-Average-Frequency clocking method. Furthermore, the compare-then-correct feedback mechanism is avoided in the construction process of Time-Average-Frequency clock signal. Instead, Time-Average-Frequency clock signal can be created by directly combining the different types of clock pulses in the train. This results in the second advantage of fast frequency switching in Time-Average-Frequency clocking method. No compare-then-correct feedback mechanism, which takes significant time to complete, is used. One example of such implementation can be found in chapter 4 of [2].

Figure 2:
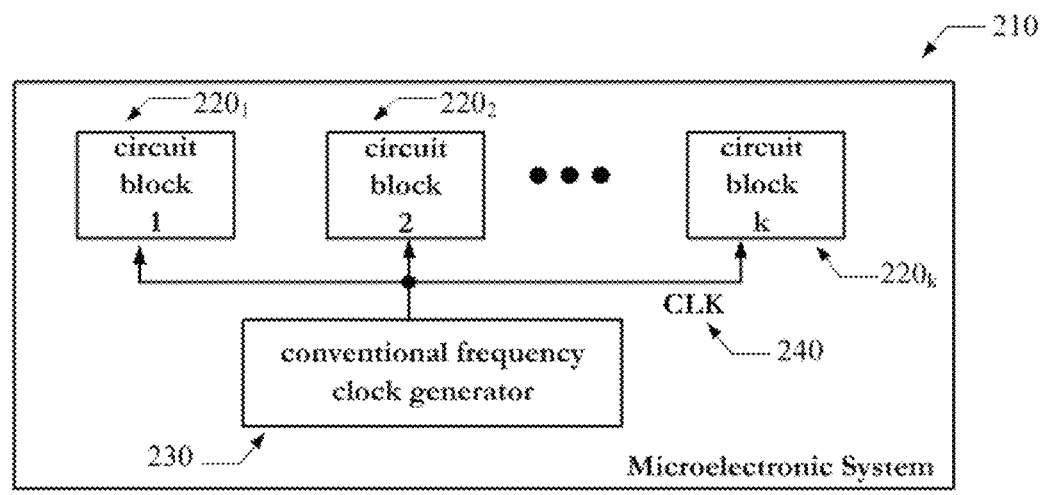
FIG. 2 is an electrical diagram, in block form, showing a microelectronic system that comprises circuit blocks and a clock generator that uses conventional frequency.
Figure 3:
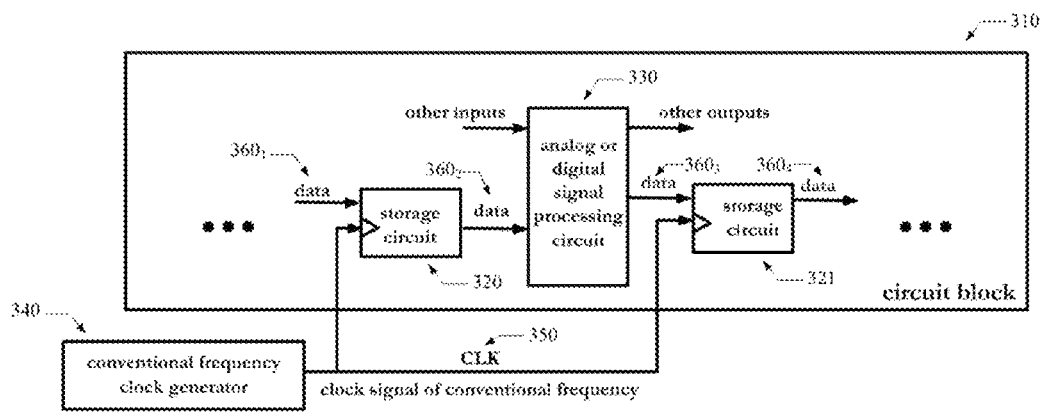
FIG. 3 is an electrical diagram, in block form, showing a clock signal that is generated by a clock generator of conventional frequency and is used to drive a circuit block.

Referring now to FIG. 2, a microelectronic system 210 contains a plurality of circuit blocks 220 that performs certain signal processing function that can be signal amplification, attenuation, filtering, and etc. In order for it to perform the specified task, it uses a clock signal CLK 240 as its time keeper. The signal CLK 240 is generated from a conventional frequency clock generator 230. Referring now to FIG. 3 which shows more operation details. The circuit block 310 contains two storage circuits 320, 321 and one signal processing circuit 330. All storage circuits 320, 321 are driven by a clock signal CLK 350 that is generated from a conventional frequency clock generator 340. Data 360 is transferred stage-by-stage through the use of storage circuits 320 and 321. In between the stages, data 360 is manipulated by the analog or digital signal processing circuit 330.

Figure 4:
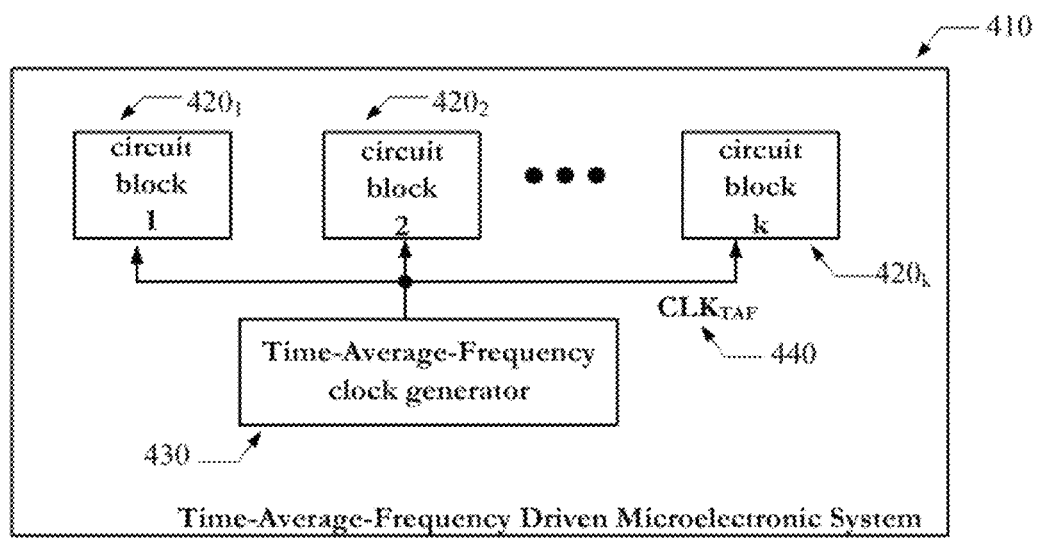
FIG. 4 is an electrical diagram, in block form, showing a microelectronic system that comprises circuit blocks and a clock generator that uses Time-Average-Frequency frequency.
Figure 5:
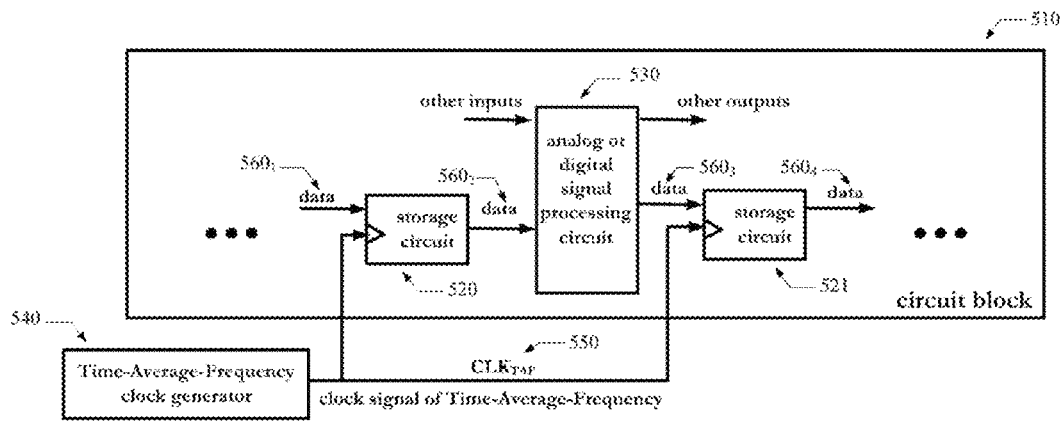
FIG. 5 is an electrical diagram, in block form, showing a clock signal that is generated by a clock generator of Time-Average-Frequency and is used to drive a circuit block.

Referring now to FIG. 4, the preferred embodiment of present invention concerns a microelectronic system 410 containing a plurality of circuit blocks 420 that performs certain signal processing function that can be signal amplification, attenuation, filtering, and etc. In order for it to perform the specified task, it uses a Time-Average-Frequency clock signal $CLK_{TAF}$ 440 as its time keeper. The signal $CLK_{TAF}$ 440 is generated from a Time-Average-Frequency clock generator 430. Referring now to FIG. 5 which shows more operation details, the circuit block 510 contains storage circuits 520, 521 and signal processing circuit 530. All storage circuits' 520, 521 clock input pins are connected to and thus are driven by a clock signal $CLK_{TAF}$ 550 that is generated from a Time-Average-Frequency clock generator 540. Data 560 is transferred stage-by-stage through the use of storage circuits 520, 521 and etc. In between the stages, data 560 is manipulated by the analog or digital signal processing circuit 530.

Figure 6:
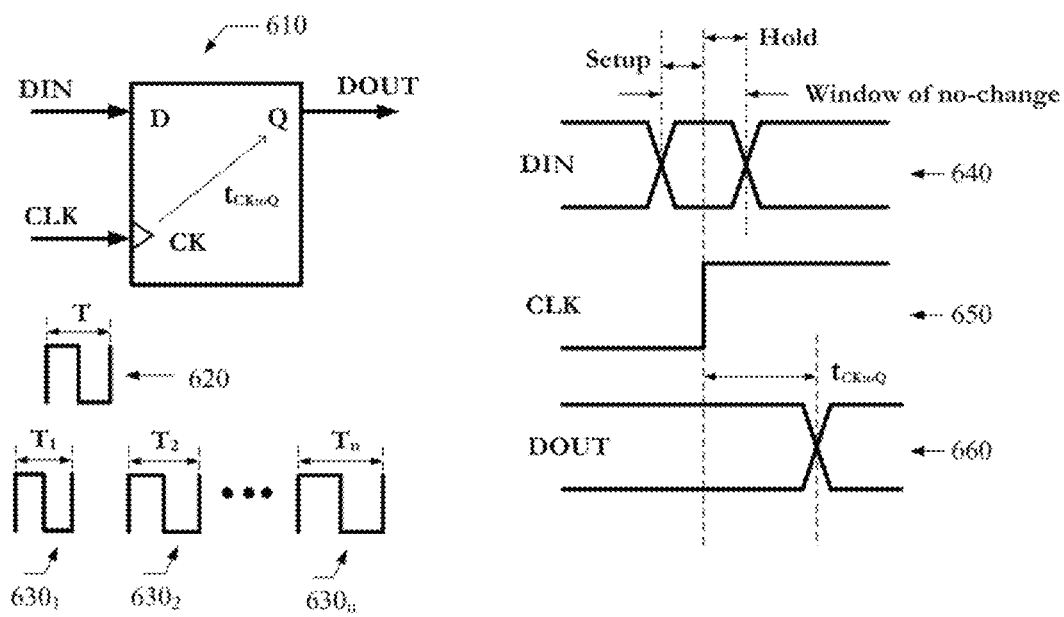
FIG. 6 is an electrical diagram showing the setup and hold checks performed on D-type flip-flop.

Referring now to FIG. 6, a D-type flip-flop 610 is shown with input signal DIN 640 connected to its D pin, output signal DOUT 660 connected to its Q pin and clock signal CLK 650 connected to its CK pin. This D-type flip-flop can be the storage circuit 320, 321, 520, 521 and etc. To ensure proper circuit operation, setup and hold checks have to be performed on this flip-flop. When a conventional clock signal of only one type of pulse 620 is used on the CK pin of the D-type flip-flop, the setup constraint is this clock's period T. In the preferred embodiment of present invention where Time-Average-Frequency clock made of multiple types of pulses $630_1$, $630_2$, ... $630_n$ is applied on the CK pin, the circuit is required to be setup-constrained using the minimum pulse length among the lengths of all the pulses which is $T_m = \min\{T_1, T_2, \ldots, T_n\}$. This discussion uses D-type flip-flop as example. However, it is understood to one skilled in the art that other sequential logic circuits, such as memory cell, could be used as storage circuit as well. In all the cases, the circuit should be setup-constrained using $T_{min} = \min\{T_1, T_2, \ldots, T_n\}$ when Time-Average-Frequency clock is used as the timekeeper of the present invention of microelectronic system. For more details on setup and hold checks of digital circuit, page 165-169 of [3] can be referenced.

The Time-Average-Frequency clock generators 430 and 540 used in present invention have the advantages of more available frequencies and faster frequency switching. By utilizing these advantages, the present invention of microelectronic system 410 is provided with opportunities of being created in lower cost fashion and equipped with more functions. It can also perform in higher performance level. The lower cost system is achieved by utilizing less complicated clock generator since less number of reference frequencies is needed when Time-Average-Frequency clock generator is used. More functions can be realized by utilizing the fast frequency switching capability of the Time-Average-Frequency clock generator. Examples include dynamical frequency scaling for low power operation, adaptive clock generation for data transfer between circuit blocks of different operating frequencies, non-uniform sampling and etc. Higher performance is made possible by utilizing both the features of more frequencies and fast frequency switching in the system, an example of such high performance system is the Time-Average-Frequency clock data recovery.

The present invention further relates to a method of using Time-Average-Frequency clock signal to drive microelectronic systems. The method generally comprises (1) generating a Time-Average-Frequency clock signal; (2) driving microelectronic systems using the said Time-Average-Frequency clock signal. (3) setup-constraining the circuits in the said microelectronic system using the minimum pulse length among all the pulses used in the said Time-Average-Frequency clock signal.

CONCLUSION/SUMMARY

Thus, the present invention provides circuitry and method for driving microelectronic systems by using Time-Average-Frequency clock signal. In conventional microelectronic systems, circuitries are driven by conventional clock signal which has two problems of limited frequencies and slow frequency switching. In this kind of system, challenges arise when lower power consumption, more functions and better performance are demanded. The present invention provides a novel solution to this problem by using Time-Average-Frequency clock signal to drive microelectronic systems. The present invention advantageously provides a significant decrease in cost and power usage, which is important for many applications.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the claims appended hereto and their equivalents.

[1] L. Xiu, "The Concept of Time-Average-Frequency and Mathematical Analysis of Flying-Adder Frequency Synthesis Architecture," *IEEE Circuit And System Magazine*, 3rd quarter, pp. 27-51, September 2008.

[2] L. Xiu, "*Nanometer Frequency Synthesis beyond Phase Locked Loop*," August 2012, John Wiley IEEE press.

[3] L. Xiu, "*VLSI Circuit Design Methodology Demystified*," November 2007, John Wiley IEEE press.

What is claimed is:

1. A microelectronic system, comprising:
   a plurality of circuit blocks for processing data, each said circuit block having a clock input for receiving clock signal, each said circuit block having a plurality of asynchronous inputs for receiving asynchronous input data, each said circuit block having a plurality of synchronous inputs for receiving synchronous input data, each said circuit block having a plurality of asynchronous outputs for delivering asynchronous output data, each said circuit block having a plurality of synchronous outputs for delivering synchronous output data;
   a Time-Average-Frequency clock generator for generating a Time-Average-Frequency clock signal, having an output for delivering said Time-Average-Frequency clock signal, said Time-Average-Frequency clock signal comprises an electrical pulse train, pulses in said electrical pulse train have more than one type of pulse length all of said pulses in said pulse train take discrete values, an arithmetic mean is a time frame of one second divided by number of pulses in said time frame of one second, an arithmetic inversion of said arithmetic mean is equal to a frequency selected by user of said microelectronic system, wherein said Time-Average-Frequency clock signal is created by directly conjoining the pulses having more than one type of pulse length; and
   wherein the output of said Time-Average-Frequency clock generator is connected to said clock inputs of all circuit blocks of said plurality of circuit blocks.

2. The microelectronic system of claim 1, wherein each said circuit block comprising:
   a first storage circuit for storing data, having a plurality of data input pins, a clock input pin and a plurality of data output pins;
   a second storage circuit for storing data, having a plurality of data input pins, a clock input pin and a plurality of data output pins;
   a signal processing circuit for processing data, having a first plurality of input pins, a second plurality of input pins, a first plurality of output pins and a second plurality of output pins;
   wherein the first plurality of input pins of said signal processing circuit is connected to the said plurality of asynchronous inputs of said circuit block;
   wherein the first plurality of output pins of said signal processing circuit is connected to the said plurality of asynchronous outputs of said circuit block;
   wherein the clock input pin of the first storage circuit and the clock input pin of the second storage circuit are connected to the clock input of said circuit block;
   wherein the said plurality of input pins of said first storage circuit is connected to the said plurality of synchronous inputs of said circuit block;
   wherein the said plurality of output pins of said first storage circuit is connected to the said plurality of second input pins of said signal processing cell;
   wherein the said plurality of output pins of said second storage circuit is connected to the said plurality of synchronous outputs of said circuit block;
   wherein the said plurality of input pins of said second storage circuit is connected to the said plurality of second output pins of said signal processing cell.

3. The microelectronic system of claim 1, wherein all circuit blocks of said plurality of circuit blocks are setup-constrained using minimum pulse length among all pulse lengths in said Time-Average-Frequency clock signal.

4. A method of creating a microelectronic system, comprising the steps of:
   creating a plurality of circuit blocks for processing data, comprising the steps of:
      creating a clock input for each circuit block of said plurality of circuit blocks, for receiving clock signal;
      creating a plurality of asynchronous inputs for each circuit block of said plurality of circuit blocks, for receiving asynchronous input data;
      creating a plurality of synchronous inputs for each circuit block of said plurality of circuit blocks, for receiving synchronous input data;
      creating a plurality of asynchronous outputs for each circuit block of said plurality of circuit blocks, for delivering asynchronous output data;
      creating a plurality of synchronous outputs for each circuit block of said plurality of circuit blocks, for delivering synchronous output data;
   creating an electrical pulse train of Time-Average-Frequency clock signal, pulses in said electrical pulse train have more than one type of pulse length, all of said pulses in said pulse train take discrete values, said Time-Average-Frequency clock signal is created by directly conjoining the pulses having more than one type of pulse length, an arithmetic mean is a time frame of one second divided by number of pulses in said time frame of one second, an arithmetic inversion of said arithmetic mean is equal to a frequency selected by user of said microelectronic system;
   connecting clock inputs of all circuit blocks of said plurality of circuit blocks to said Time-Average-Frequency clock signal.

5. The method of claim 4, further comprising the steps of:
   creating a first storage circuit for each said circuit block, for storing data, having a plurality of data input pins, a clock input pin and a plurality of data output pins;
   creating a second storage circuit for each said circuit block, for storing data, having a plurality of data input pins, a clock input pin and a plurality of data output pins;
   creating a signal processing circuit for each said circuit block, for processing data, having a plurality of first input pins, a plurality of second input pins, a plurality of first output pins and a plurality of second output pins;
   connecting the said plurality of first input pins of said signal processing circuit to the said plurality of asynchronous inputs of said circuit block;
   connecting the said plurality of first output pins of said signal processing circuit to the said plurality of asynchronous outputs of said circuit block;
   connecting the clock input pin of the first storage circuit and the clock input pin of the second storage circuit to the clock input of said circuit block;

connecting the said plurality of input pins of said first storage circuit to the said plurality of synchronous inputs of said circuit block;

connecting the said plurality of output pins of said first storage circuit to the said plurality of second input pins of said signal processing cell;

connecting the said plurality of output pins of said second storage circuit to the said plurality of synchronous outputs of said circuit block;

connecting the said plurality of input pins of said second storage circuit to the said plurality of second output pins of said signal processing cell.

6. The method of claim 4, further comprising the step of:

setup-constraining all circuit blocks of said plurality of circuit blocks by using minimum pulse length among all pulse lengths of said Time-Average-Frequency clock signal.

\* \* \* \* \*